(12) United States Patent
Rafi et al.

(10) Patent No.: US 8,385,867 B2
(45) Date of Patent: Feb. 26, 2013

(54) TRACKING FILTER FOR A TELEVISION TUNER

(75) Inventors: Aslamali A. Rafi, Austin, TX (US); Chunyu Xin, Austin, TX (US); Ruifeng Sun, Austin, TX (US); Abhishek Kammula, Austin, TX (US); Ramin Khoini-Poorfard, Austin, TX (US); Alessandro Piovaccari, Austin, TX (US); Peter J. Vancorenland, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 520 days.

(21) Appl. No.: 12/493,819

(22) Filed: Jun. 29, 2009

(65) Prior Publication Data

US 2010/0328546 A1  Dec. 30, 2010

(51) Int. Cl.
  *H04B 1/18* (2006.01)
(52) U.S. Cl. ............... 455/150.1; 455/178.1; 455/191.1; 327/554; 327/555
(58) Field of Classification Search .............. 455/424, 455/425, 456.5, 456.6, 561, 550.1, 575.1, 455/337, 292, 234.2, 232.1, 130, 200.1, 340, 455/76, 302, 150.1, 151.1, 188.1, 191.2, 455/191.3, 266, 333, 334, 339; 327/554, 327/555, 557, 558, 559; 348/731, 726; 333/202, 333/207, 174, 172, 205, 209, 81 R
See application file for complete search history.

(56) References Cited

U.S. PATENT DOCUMENTS

| | | | |
|---|---|---|---|
| 4,364,116 A | 12/1982 | Nossek | |
| 4,662,001 A * | 4/1987 | Cruz et al. | 455/340 |
| 4,714,906 A * | 12/1987 | D'Albaret et al. | 333/202 |
| 4,969,207 A * | 11/1990 | Sakamoto et al. | 455/134 |
| 5,059,892 A * | 10/1991 | Stoft | 324/73.1 |
| 5,060,297 A * | 10/1991 | Ma et al. | 455/302 |
| 5,065,120 A * | 11/1991 | Munn | 333/207 |
| 5,227,748 A * | 7/1993 | Sroka | 333/207 |
| 5,495,215 A * | 2/1996 | Newell et al. | 333/202 |
| 5,572,264 A * | 11/1996 | Mizukami et al. | 348/735 |
| 5,737,035 A | 4/1998 | Rotzoll | |
| 5,774,555 A * | 6/1998 | Lee et al. | 381/4 |
| 5,950,112 A * | 9/1999 | Hori et al. | 725/148 |
| 6,011,959 A * | 1/2000 | Reeser et al. | 455/76 |

(Continued)

FOREIGN PATENT DOCUMENTS

WO  WO 03/067877  8/2003

OTHER PUBLICATIONS

"Applications of Switched-Capacitor Circuits in Active Filters and Instrumentation Amplifiers," Dr. William R. Grisé, Department of IET, Morehead State University, Technology Interface, vol. 3 No. 3, Fall 1999, ISSN# 1523-9926.

(Continued)

*Primary Examiner* — Duc Nguyen
*Assistant Examiner* — Charles Chow
(74) *Attorney, Agent, or Firm* — Trop, Pruner & Hu, P.C.

(57) ABSTRACT

In one embodiment, a set of tracking filters to be coupled between an amplifier and a mixer is provided. The tracking filters may be differently configured depending on band of operation. For example, a first set of the filters can be configured to maintain a substantially constant Q value across their operating bandwidth while a second set of the filters can be configured to maintain a substantially constant bandwidth across their operating bandwidth.

17 Claims, 10 Drawing Sheets

U.S. PATENT DOCUMENTS

| | | | |
|---|---|---|---|
| 6,177,964 | B1 | 1/2001 | Birleson et al. |
| 6,377,315 | B1 | 4/2002 | Carr et al. |
| 6,453,157 | B1 * | 9/2002 | Roberts .................. 455/337 |
| 6,538,499 | B1 * | 3/2003 | Lu .................. 327/557 |
| 6,549,096 | B2 | 4/2003 | Groves et al. |
| 6,549,763 | B1 * | 4/2003 | Imai et al. .................. 455/249.1 |
| 6,594,476 | B1 * | 7/2003 | Flanagan et al. ........... 455/278.1 |
| 6,778,117 | B1 | 8/2004 | Johnson |
| 6,791,434 | B2 * | 9/2004 | Tsujiguchi .................. 333/172 |
| 6,885,275 | B1 * | 4/2005 | Chang .................. 336/200 |
| 6,889,036 | B2 * | 5/2005 | Ballweber et al. ........... 455/292 |
| 7,027,314 | B2 * | 4/2006 | Soto et al. .................. 363/39 |
| 7,265,792 | B2 | 9/2007 | Favrat et al. |
| 7,305,223 | B2 | 12/2007 | Liu et al. |
| 7,310,505 | B2 * | 12/2007 | Dobrovolny ............... 455/234.1 |
| 7,369,835 | B2 | 5/2008 | Margairas et al. |
| 7,376,400 | B2 * | 5/2008 | Bellaouar et al. ............ 455/130 |
| 7,539,470 | B2 * | 5/2009 | Kim et al. .................... 455/130 |
| 2003/0227354 | A1 * | 12/2003 | Utsunomiya et al. ........ 333/174 |
| 2005/0118971 | A1 * | 6/2005 | Arai et al. .................. 455/232.1 |
| 2006/0281431 | A1 * | 12/2006 | Isaac et al. .................... 455/323 |
| 2008/0207153 | A1 * | 8/2008 | Choi .......................... 455/200.1 |
| 2009/0251618 | A1 * | 10/2009 | Gao et al. ...................... 348/731 |
| 2010/0130153 | A1 * | 5/2010 | Khoini-Poorfard et al. .......................... 455/234.2 |

OTHER PUBLICATIONS

"Novel LC Pseudo Switched Capacitor Filter Suited for Wireless RF Applications," Ahmed El Oualkadi et al., IEICE Electronics Express, vol. 2, No. 8, Apr. 2005, pp. 286-291.

Micronas, "DRX 3960A Digital Receiver Front-End," Feb. 8, 2001, pp. 1-30.

NXP, "TDA 8295 Digital Global Standard Low IF Demodulator for Analog TV and FM Radio," Feb. 4, 2008, pp. 1-77.

Xceive, "Welcome to Xceive at CES 2007, Upgrade Your Tuner! Get XC5000," 2007, pp. 1-28.

Xceive, "XC5000 Product Brief," Dec. 2006, pp. 1-2.

U.S. Appl. No. 12/277,866, filed Nov. 25, 2008, entitled "Low-Cost Receiver Using Tracking Filter," by Ramin Khoini-Poorfard, et al.

U.S. Appl. No. 12/277,908, filed Nov. 25, 2008, entitled "Low-Cost Receiver Using Tracking Bandpass Filter and Lowpass Filter," by Ramin Khoini-Poorfard, et al.

* cited by examiner $$g_p(k) = 2w_o^2 c^2 \sum_{i=1}^{1 \le} ri$$

NOTE: $w_o = f(k)$

TRACKING FILTER FOR A TELEVISION TUNER

BACKGROUND

Due to the ever increasing functionality available in integrated circuits, it is possible to form a television (TV) tuner from a single integrated circuit (IC). Such a tuner can include both radio frequency (RF) and baseband circuitry to receive a RF TV signal such as a cable, terrestrial or satellite signal, downconvert the signal to baseband and perform processing on the signal to obtain a video signal for output to a display of a system such as a flat panel TV, computer system, portable device, mobile device, or so forth.

As more functionality is implemented into a single integrated circuit, the incorporation of RF and digital processing can lead to increased noise concerns, as the prevalent switching of digital circuitry (including both digital clocks as well as digital data processing circuits) can create harmonics as well data dependent noise that may interfere with receipt and processing of the incoming RF signals. Furthermore, a TV tuner should be able to receive a broadcast signal under a wide range of input conditions. For example, a TV tuner might have to receive a very weak desired signal (e.g., −68 dBm) in the presence of a very strong undesired signal (at about −11 dBm) with a decent desired signal-to-noise ratio.

Furthermore, for broadcast receivers, a very wide bandwidth in which channels may exist is present. In current systems, TV channels range from very high frequency (VHF) frequencies of approximately 50 megahertz (MHz) up to ultra high frequency (UHF) signals that can be at or near one gigahertz (GHz). Due to this very wide frequency range, one or more tracking filters may be present. However, there can be great difficulty in providing an appropriate tracking filter due to the wide range of frequencies at which the filter is to operate and competing constraints are present at these different frequencies. A need thus exists for an improved tracking filter.

SUMMARY OF THE INVENTION

According to one aspect, the present invention includes an apparatus with a low noise amplifier (LNA) to receive and amplify a radio frequency (RF) signal, tracking filters coupled to the LNA to filter the amplified RF signal, and a mixer coupled to the tracking filters to receive and downconvert the filtered RF signal. In one implementation, the tracking filters may be differently configured depending on band of operation. For example, a first set of the filters can be configured to maintain a substantially constant Q value across their operating bandwidth while a second set of the filters can be configured to maintain a substantially constant bandwidth across their operating bandwidth. One or more of the tracking filters can have magnetically differential inductors having at least one positive turn and at least one negative turn that are cross-coupled, and at least one of the tracking filters includes a magnetically single-ended inductor. In some implementations, a capacitive attenuator can be coupled between the tracking filters and the mixer, and may be controllable based on a compensation factor for a given tracking filter that enables the apparatus to maintain filter tuning at the corresponding capacitive attenuator setting.

Another aspect of the present invention is directed to a tracking filter to be coupled between a front end amplifier and a mixer. The tracking filter includes multiple tanks each to cover a band of television channels, where at least one of the tanks has a magnetically differential inductor with cross-coupled turns that travel between different layers of a semiconductor die. The tanks each further have a capacitor array including a set of parallel paths having at least one capacitor and a switching device to controllably couple the corresponding at least one capacitor to a signal path. In some implementations, a Q profile of the capacitor array increases over an increasing frequency range of the corresponding band.

Yet another aspect of the present invention is directed to a method to tune a set of compensation values for a capacitive attenuator coupled between a tracking filter and mixer. The method includes, in one embodiment, setting a tuning value for a capacitor array of a tracking filter to an initial value for a corresponding setting of the capacitive attenuator, setting a threshold of a peak detector to cause an output of the tracking filter to trip the peak detector, and decrementing the peak detector threshold. Then the tuning value is sequentially incremented and it is determined whether the peak detector trips, until the peak detector does not trip. Thereafter, the tuning value when the peak detector does not trip is stored. A similar process occurs while sequentially decrementing the tuning value, and the tuning value when the peak detector does not trip is again stored. From these values, a tuning code for the capacitor array is calculated and stored for use as a compensation value.

DETAILED DESCRIPTION

In various embodiments, a tracking filter implementation may be realized by providing a plurality of tracking filters each dedicated to a different frequency range of a TV spectrum. In this way, different ones of the filters may be optimized for constraints present at the given frequency range. Given the wide variety of input conditions possible, for a low cost silicon implementation of a tuner, undesired signals should be filtered before downconversion to lower intermediate frequencies (IF) takes place, so that the dynamic range of the analog receive chain can be reduced to reasonable and silicon implementable levels. Further, this filter may be tunable so that any desired channel frequency in the TV spectrum can be received. Embodiments may be of a high quality factor (or low bandwidth) so that it lets only the desired signal pass through but filters out as much of the undesired channel as possible.

Embodiments may further provide a magnetically differential inductor configuration that can be used in forming the tracking filters, which may be formed of such inductors and capacitors to realize LC tanks. In addition to configuring differently the inductors for different frequency ranges, so too can the capacitor implementations also be configured differently for different frequency ranges. Embodiments may further provide for an attenuator network coupled to an output of the tracking filters to provide gain control prior to passing a filtered signal to a mixing stage. Because the variable attenuation may alter the capacitance of the tracking filters, also provided is a method for tuning the tracking filters to handle changes in attenuation that may occur during system operation.

Figure 1:
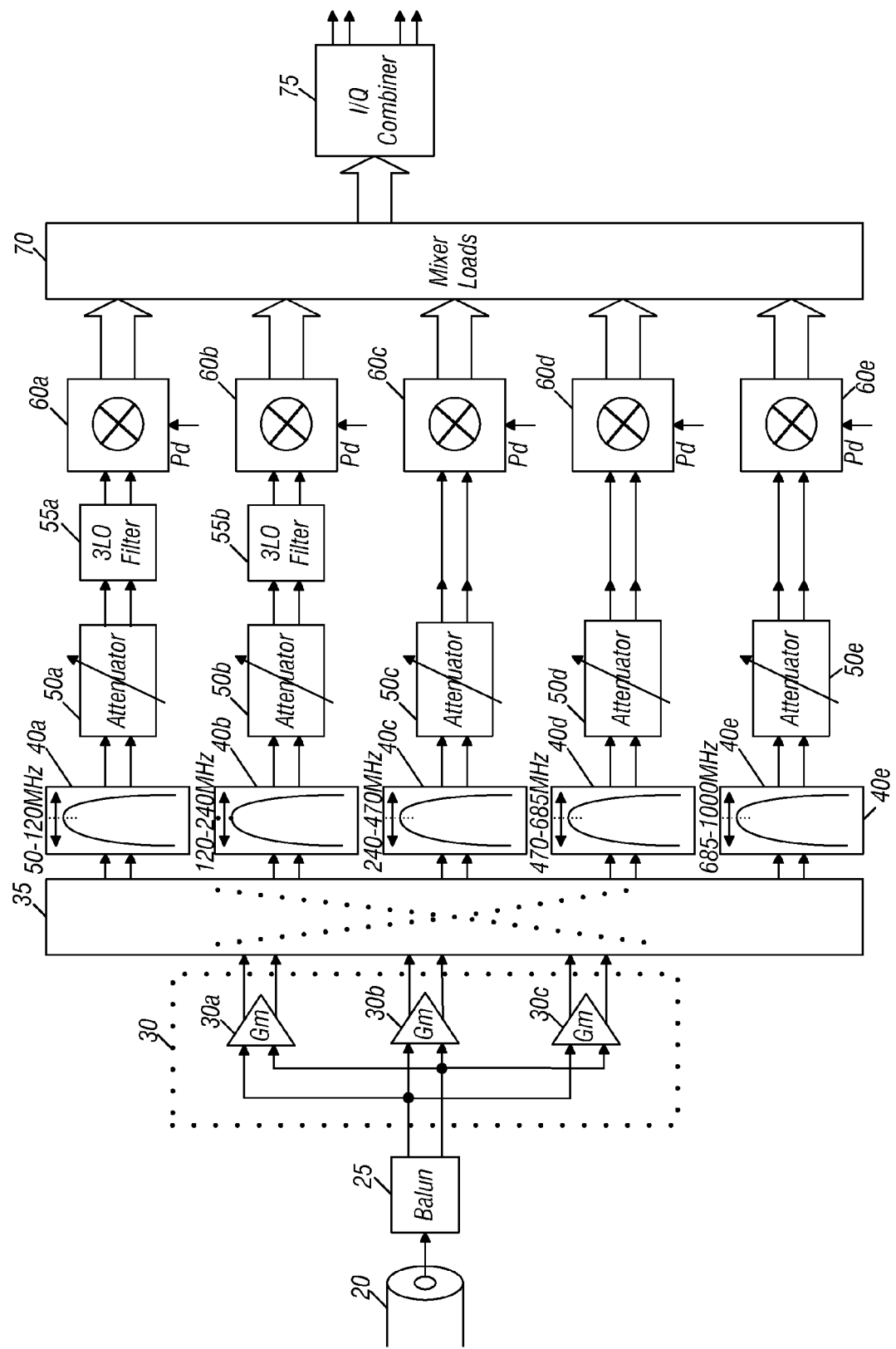
FIG. 1 is a block diagram of a portion of an analog front end of a TV tuner in accordance with one embodiment of the present invention.

Referring now to FIG. 1, shown is a block diagram of a portion of a front end of a TV tuner in accordance with one embodiment of the present invention. As shown in FIG. 1, the portion may correspond to an analog front end that receives incoming RF signals and processes and downconverts them to a lower frequency, e.g. an intermediate frequency (IF). In different implementations, such downconversion may be to a low intermediate frequency (LIF) or zero-IF (ZIP), baseband, or other frequency. As seen in FIG. 1, an incoming signal may be provided via a signal path 20, which may be a connection to an antenna, cable source or other input device. The RF signals pass through a balun 25 and to a low noise amplifier (LNA) 30. As seen, LNA 30 may include parallel paths $30_a$-$30_c$ to provide adjustable gain control. In various embodiments, each gain path may include the same or differing amounts of gain. As will be discussed further below, one or more of gain stages $30_a$-$30_c$ may be active based on control of, e.g., a microcontroller. In turn, the amplified signals may be provided to a switch matrix 35 such as a current switch matrix that acts as a filter selector to switch the signals to a selected one of a plurality of tracking filters $40_a$-$40_e$, also under control of the microcontroller. Note that while shown with five such tracking filters in the embodiment of FIG. 1, the scope of the present invention is not limited in this regard. As will be described further below, each tracking filter 40 may be formed of an inductor and capacitor, and which may be implemented via a magnetically differential inductor and a controllable capacitance.

After filtering, the filtered signal may be provided to a variable attenuator stage including a plurality of attenuators $50_a$-$50_e$. In various implementations, attenuator 50 may be a controllable capacitive attenuator. Note that the lower band signals may be passed through another filter $55_a$ and $55_b$ to filter out the undesired signal around a harmonic of a local oscillator (LO) frequency.

Then the signals may be provided to one of a plurality of mixers $60_a$-$60_e$. In one embodiment, the mixers may be realized by a rotating harmonic mixer, although the scope of the present invention is not limited in this regard. The selected mixer stage may downconvert the incoming signal, e.g., to a low IF or LIF value. The downconverted signal may be provided to a mixer load array 70 which may perform gaining and filtering of the mixed signal. From there, the downconverted signal passes through an I/Q combiner 75 which outputs the signals on an I path and a Q path to, e.g., IF circuitry that may perform further processing such as additional gaining and filtering operations, before the resulting signals are provided for digital processing in a digital signal processor (DSP) of the tuner. While shown with this particular implementation in the embodiment of FIG. 1, the scope of the present invention is not limited in this regard.

Figure 2:
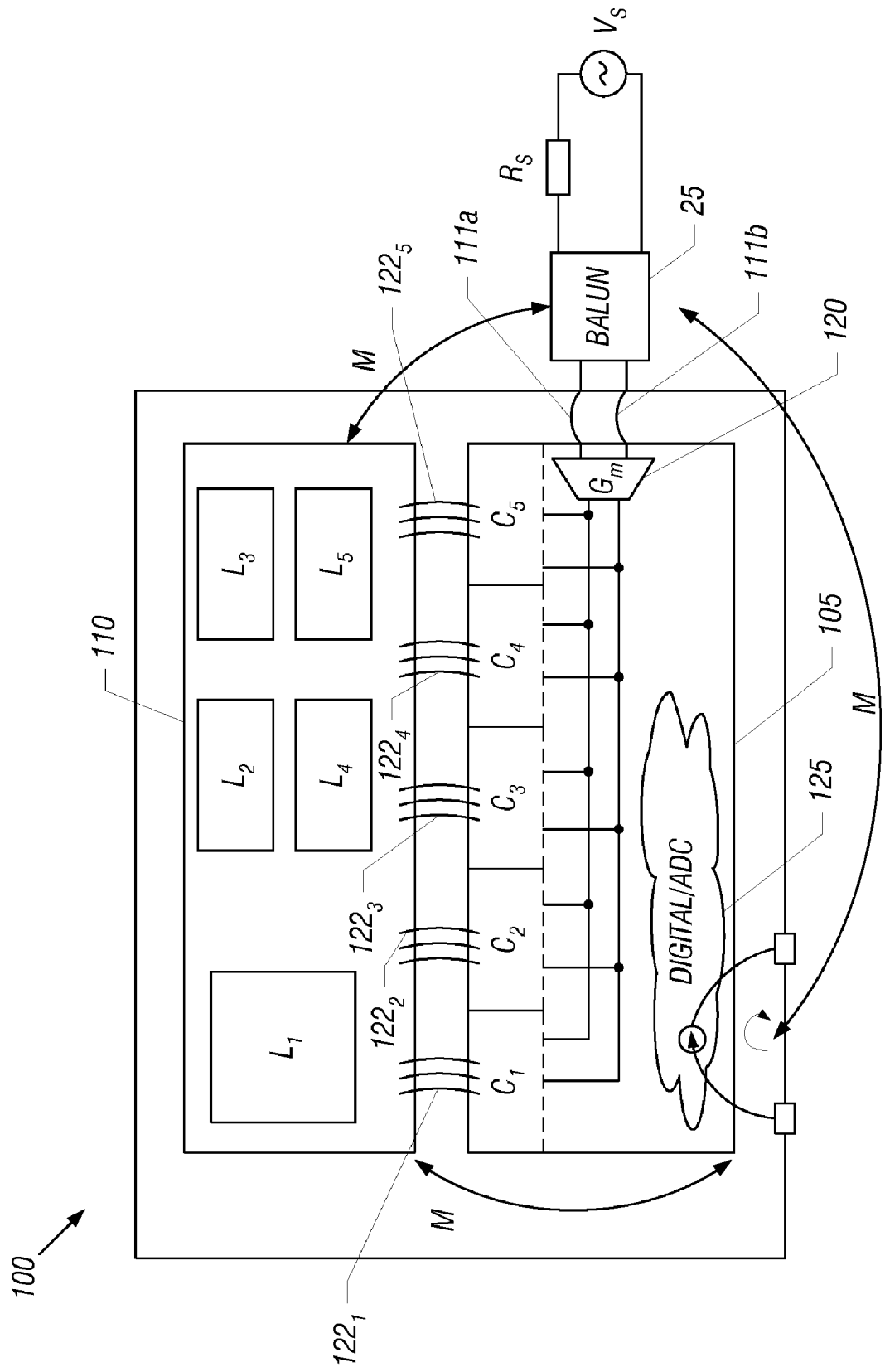
FIG. 2 is a block diagram of a TV tuner in accordance with one embodiment of the present invention.

To understand the nature of noise that may affect the tracking filter, it is instructive to consider an implementation of a single chip TV tuner. Referring now to FIG. 2, shown is a block diagram of a TV tuner in accordance with one embodiment of the present invention. As shown in FIG. 2, tuner 100 may be an integrated circuit formed of one or more semiconductor dies. In the embodiment shown in FIG. 2, two dies 105 and 110 are present, however it is to be understood that other implementations may be formed of a single die. As seen in FIG. 2, first die 105 includes all RF, IF and baseband components, with the exception of the inductors for the tracking filters, which may be present on second die 110. Incoming signals (which may be received from an antenna) are provided by a signal source $V_S$ and through a source resistance $R_S$ and onto the chip via, e.g., bond wires 111a and 111b. The incoming signal is provided to an LNA 120. As controlled by the switching network, the output of LNA 120 is provided to one of a plurality of tracking filters each formed of a capacitance $C_1$-$C_5$ and an inductance $L_1$-$L_5$. As seen, different sets of bond wires $122_1$-$122_5$ couple the LC tank of the tracking filters. In turn, the filtered signals are provided to further analog circuitry that is present along with digital circuitry 125 on first semiconductor die 105.

As seen in FIG. 2, various sources of magnetic interference may inhere. Specifically, a clock signal received in digital portion 125 from off chip may cause magnetic signals M to couple into the inductors. Similarly, magnetic signals due to digital escape from the digital currents on chip as well as data dependent energy couple to the tracking filters and potentially degrade the noise figure of the tracking filters. Accordingly, in various embodiments to reduce such noise, the inductors may be formed of magnetically differential inductors.

As described above, in various embodiments the LNA load may be a set of tracking filters in accordance with an embodiment of the present invention. In different implementations, the tracking filters may be realized in a parallel LC configuration with a predetermined number of filters to cover a desired frequency spectrum. In one embodiment, 5 LCs may cover a frequency range of approximately 50 MHz-1000 MHz. To realize correct filtering over a wide frequency range, embodiments may implement a combination of a constant Q or constant bandwidth (BW) technique depending on band.

Figure 3:
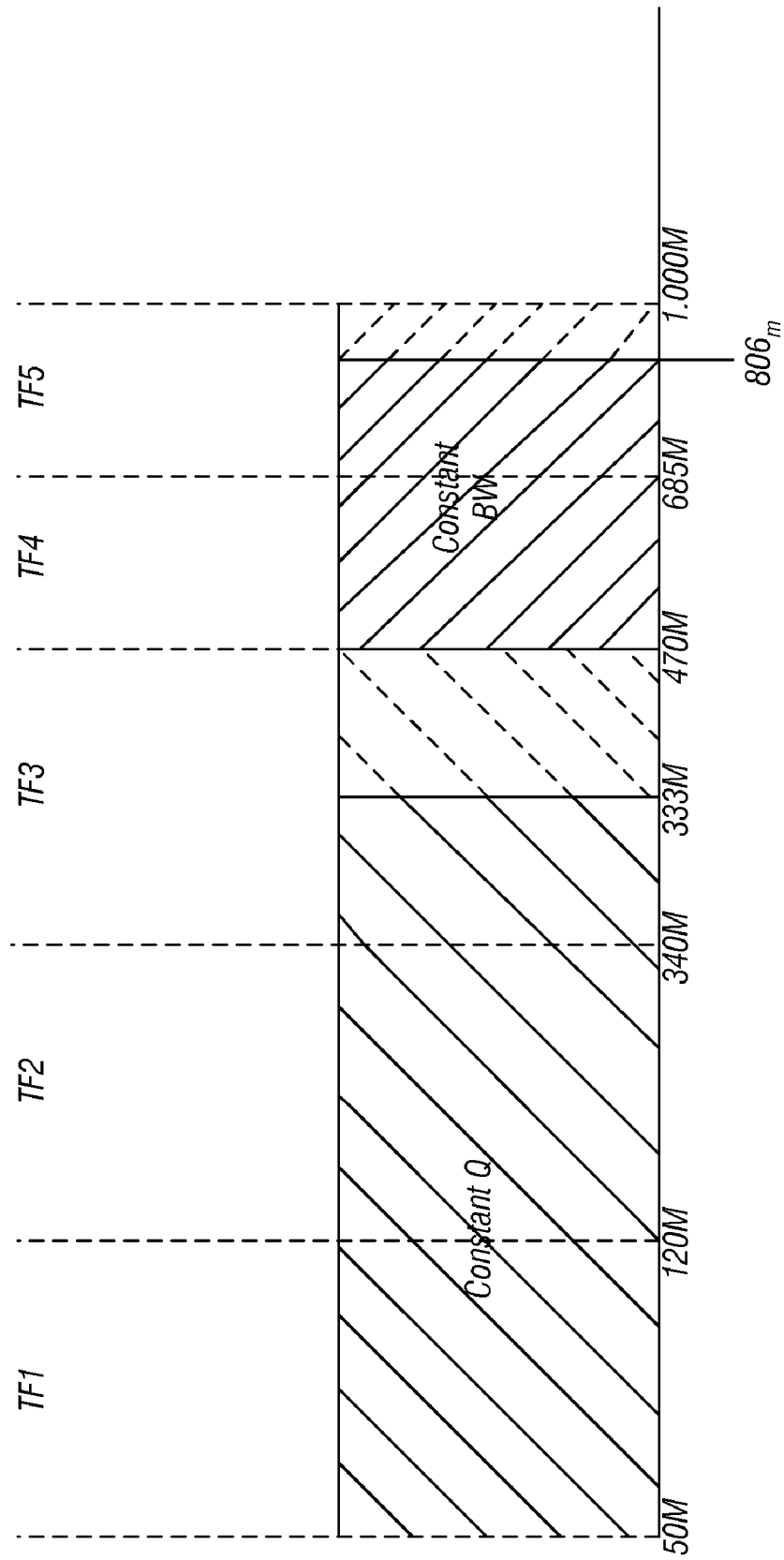
FIG. 3 is a frequency spectrum breakdown of a tracking filter implementation in accordance with one embodiment of the present invention.

Some details of the requirements of the different bands illustrate these considerations. Referring now to FIG. 3, shown is a frequency spectrum breakdown of a tracking filter implementation in accordance with one embodiment of the present invention. As shown in FIG. 3, different characteristics of a tracking filter are more significant at different portions of a frequency spectrum. For lower frequencies, e.g., approximately 50-337 MHz, the dominant concern is to filter the undesired signals at the frequencies around the LO harmonics. Since LO harmonics bear a fixed ratio to LO fundamental, the purpose of the tracking filter is to is provide a given attenuation at a given undesired frequency ratio to desired frequency ratio. For these frequencies, constant Q filters are used. On the other hand, for higher desired frequencies, since the LO frequencies are high too, the harmonics of LO lie outside of the desired TV spectrum (approximately 50-1000 MHz band). So tracking filter attenuation at a fixed frequency ratio is not as important. But there could be large undesired signals at a given frequency offset (N+/−6, for example). So for these frequencies, tracking filter attenuation at a given frequency offset is important. Here constant BW filters are used.

Specifically, as seen in FIG. 3 at lower end frequencies attenuation at a constant frequency ratio is important, while at higher frequencies, attenuation at a constant frequency offset is important. Thus in general, over a first portion of the frequency spectrum (e.g., at the lower frequencies), a constant Q may be a prime consideration of the tracking filter, while at a second frequency range corresponding to higher frequencies, a constant bandwidth may be considered to be the prime consideration. Shown in FIG. 3 is the segmentation of the tracking filters in accordance with one embodiment of the present invention. While shown as having different bandwidths and being set at different frequencies, understand that the scope of the present invention is not limited in this regard. In one embodiment such as represented in FIG. 3, the tracking filter bands may be split to have varying ratios of maximum frequency to minimum frequency. Specifically, in the implementation of FIG. 3, $F_{max} \div F_{min}$ may correspond to 2.4x, 2x, ~2x, $-\sqrt{2x}$, $-\sqrt{2x}$, for bands 1-5, respectively.

For a tuner at UHF, N+6 attenuation equals 6 db which leads to stringent BW of the tracking filter (TF) (approximately 40 MHz). Thus for this high frequency range, attenuation at constant frequency offset is important. However, for $VHF_{H/L}$, harmonic rejection/harmonic distortion (HR/HD) considerations set the TF BW. Thus at these low frequency ranges, attenuation at constant frequency ratio is important. For cable bands in between, the $HR_{req}$ equals 67 dB. For a CTB test, the TF BW sets a number of channels seen by the mixer. TF BW equals 80 MHz and meets CTB test comfortably. $HR_3$ considerations set TF BW for most channels (except channels close to 470 MHz). Thus in this frequency range, attenuation at constant frequency ratio is important.

Thus to meet these different constraints, at lower frequency bands a tracking filter may provide for a constant Q, while at higher frequency bands the TF may provide for a constant bandwidth. In the range between these bands, e.g., at frequencies between approximately 333 MHz and 470 MHz, since it may be part of a TF for a lower frequency band (e.g., TF3 of FIG. 3), constant Q is extended for this band as well. For frequencies between approximately 806 MHz and 1000 MHz (since it is a part of $TF_5$ in the example of FIG. 3) constant bandwidth is extended for this range also.

Embodiments may also provide for digital compensation of attenuator capacitor changes occurring in embodiments including a capacitor attenuator following the tracking filter. That is, the input capacitance ($C_{in}$) to this attenuator changes as a function of attenuation, but a tuning or compensation capacitance ($C_{tune}$) can be used to compensate for this change. In various embodiments, at every channel change, the TF is tuned for different attenuator settings (e.g., approximately 10) and these $C_{tune}$ values are stored in a table. These values are re-used to adjust $C_{tune}$ when a different attenuation level is set, e.g., according to an AGC algorithm.

As described above, in various implementations the inductance portions of the tracking filters can be realized via a magnetically differential implementation. In this manner, noise immunity may be increased both due to spurious digital noise from the digital portions of the device, as well as by providing common mode rejection. In this regard, it is noted that the tracking filters are coupled between LNA and mixer. In given implementations both of these devices may include transconductors that do not posses common mode rejection. Because there is a limited amount of common mode rejection available, e.g., via a balun at the front end of an LNA, it may be desirable to reject common mode signal currents present at the LNA output prior to input to the mixer. Accordingly, a magnetically differential implementation in accordance with an embodiment of the present invention may reduce such common mode currents by providing common mode rejection.

Figure 4A:
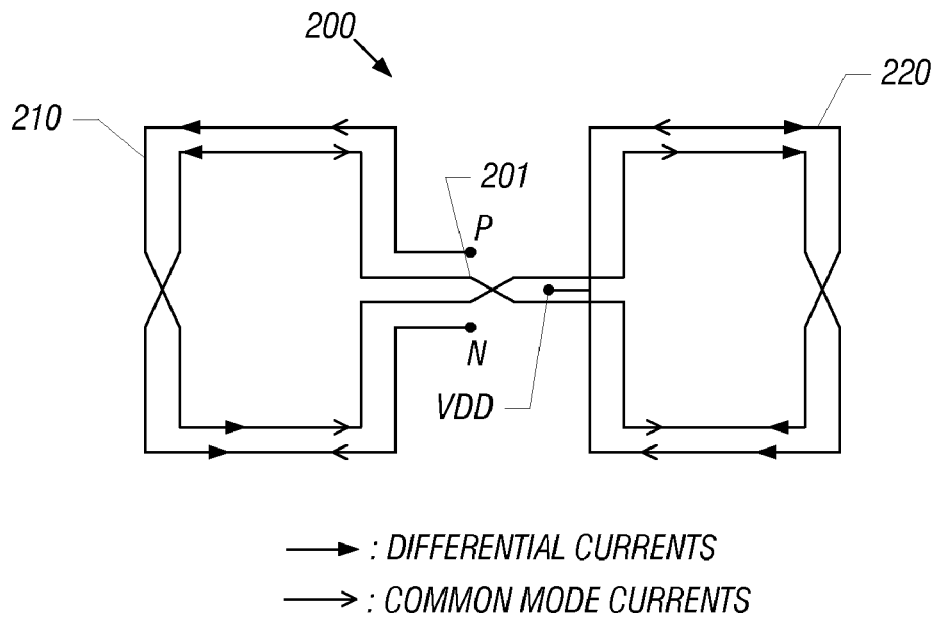
FIGS. 4A-C are a representation of a magnetically differential inductor in accordance with one embodiment of the present invention.

Referring now to FIG. 4A, shown is a representation of a magnetically differential inductor in accordance with one embodiment of the present invention. As shown in FIG. 4A, a parallel inductor 200 is formed of a first turn 210 and a second turn 220. As seen, both of these coils have a differential configuration including both positive and negative portions. Still further, each coil provides cross coupling, which may be realized by a two-layer structure such that the inductor paths begin on a first metal layer of a semiconductor device or integrated passive device and cross to a second layer and vice-versa, at the cross coupling point 201.

As seen in FIG. 4A, the positive portion has differential and common mode currents traveling in the same direction, while the negative portion may have differential and common mode currents that oppose each other. The inductance paths may begin at input nodes P and N. The inductor may have a center tap coupled to a supply voltage, e.g., VDD.

Figure 4B:
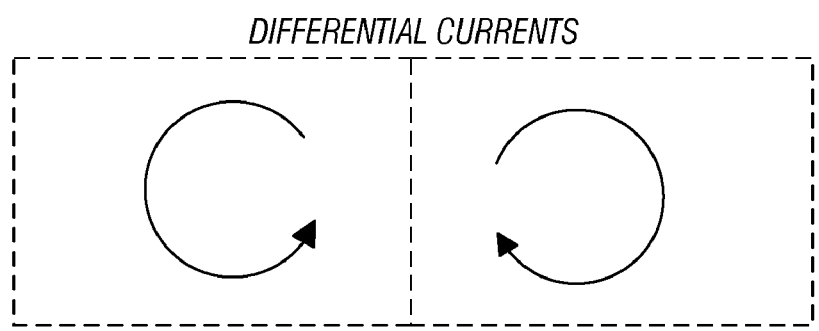
Figure 4C:
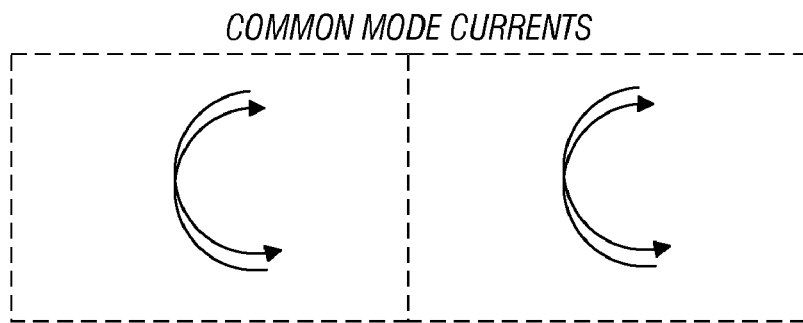

Due to the differential currents present in the inductor, as shown in FIG. 4B, magnetic fields due to the two parallel coils are substantially equal and opposite and thus substantially cancel each other out. Similarly, as shown in FIG. 4C for the common mode currents, the magnetic fields within a given portion substantially cancel each other out as the common mode currents in the adjacent turns cancel each other. Since the magnetic field due to both common mode and differential mode currents is substantially reduced at a point outside the inductance structure, this also implies, by the principle of duality, that a stray magnetic field (from digital switching for example) would induce a substantially lesser common mode and differential mode voltage at the inductor's input. Accordingly, an implementation such as shown in FIG. 4A provides for substantial reduction of magnetic field coupling due to noise.

Figure 5:
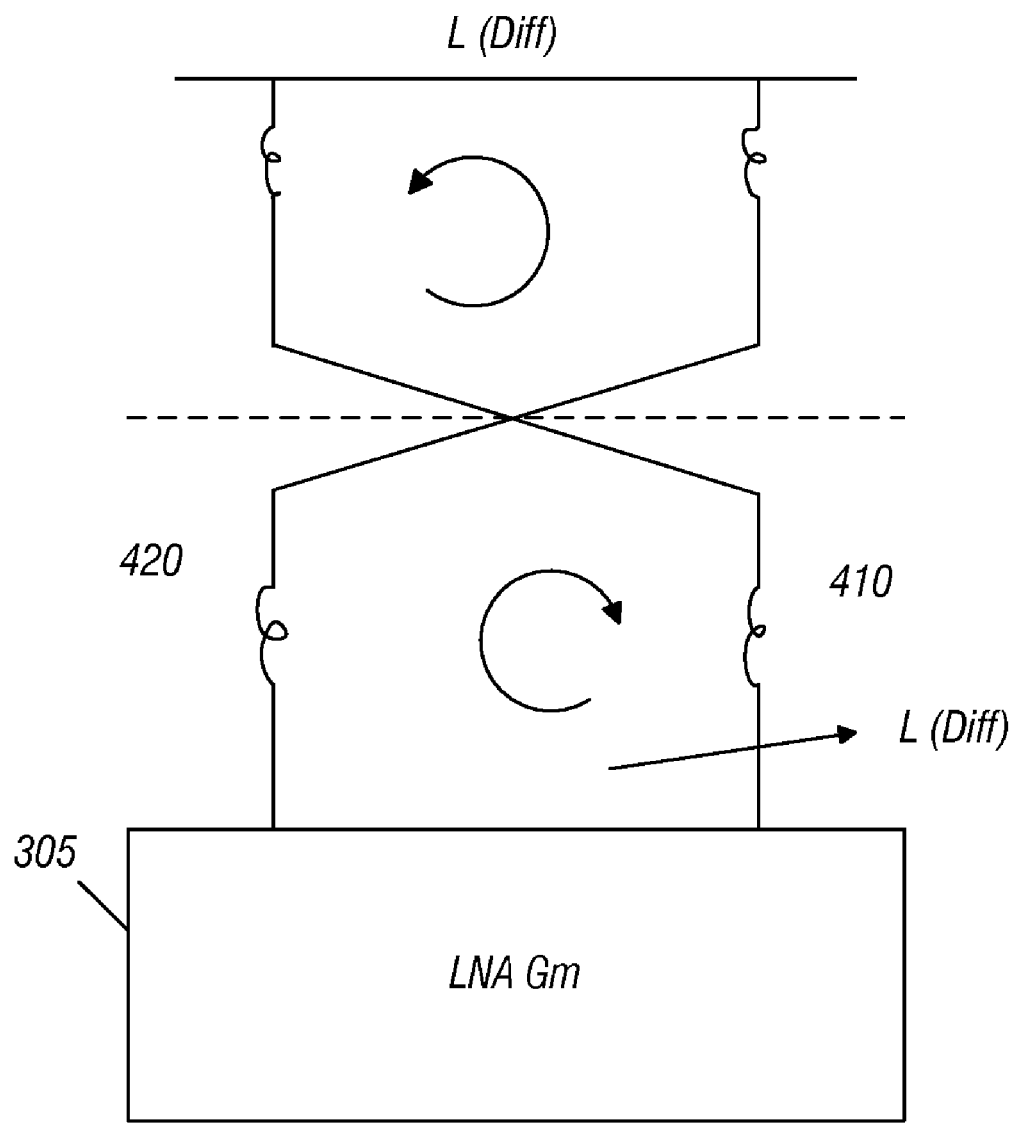
FIG. 5 is a schematic representation of a magnetically differential inductor implementation in accordance with an embodiment of the present invention.

Referring now to FIG. 5, shown is a schematic representation of a magnetically differential inductor implementation in accordance with an embodiment of the present invention. As shown in FIG. 5, a parallel, cross-coupled differential inductor stage 300 is shown and is coupled to an output of an LNA transconductor 305. Note that the dashed line in FIG. 5 represents the cross-coupling point 201 in FIG. 4A. An implementation such as this may provide for a small common mode inductance and common mode magnetic fields, along with a small common mode Q.

Figure 6A:
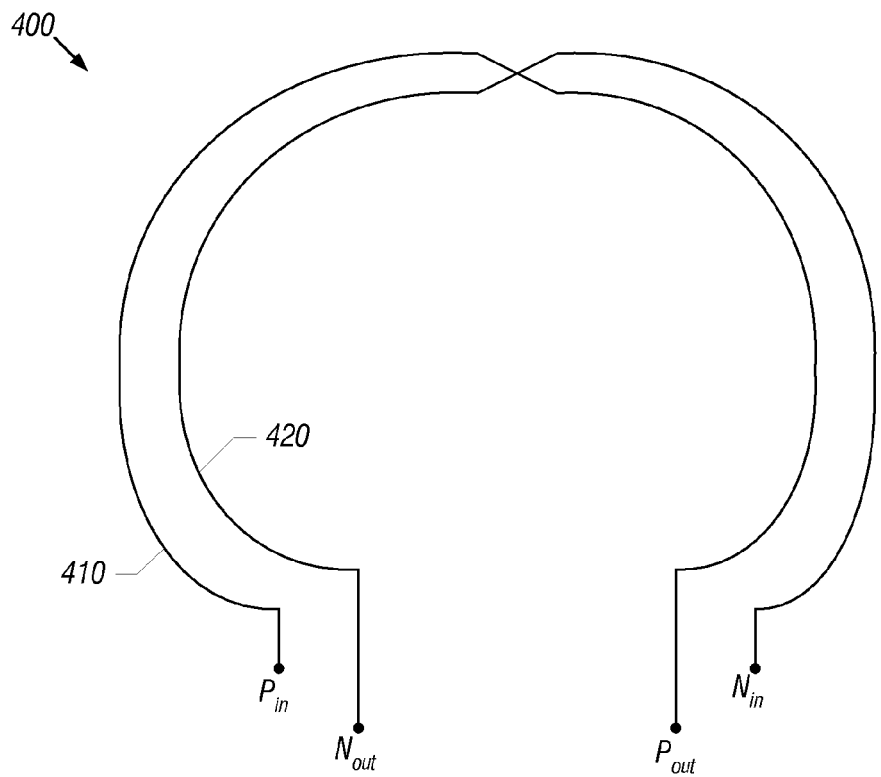
FIGS. 6A-6C are illustrations of structures for a tracking filter inductor in accordance with one embodiment of the present invention.
Figure 6B:
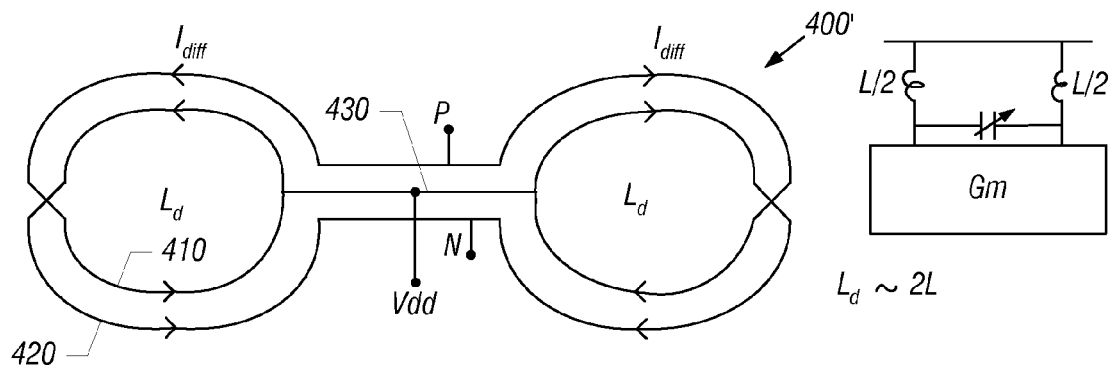
Figure 6C:
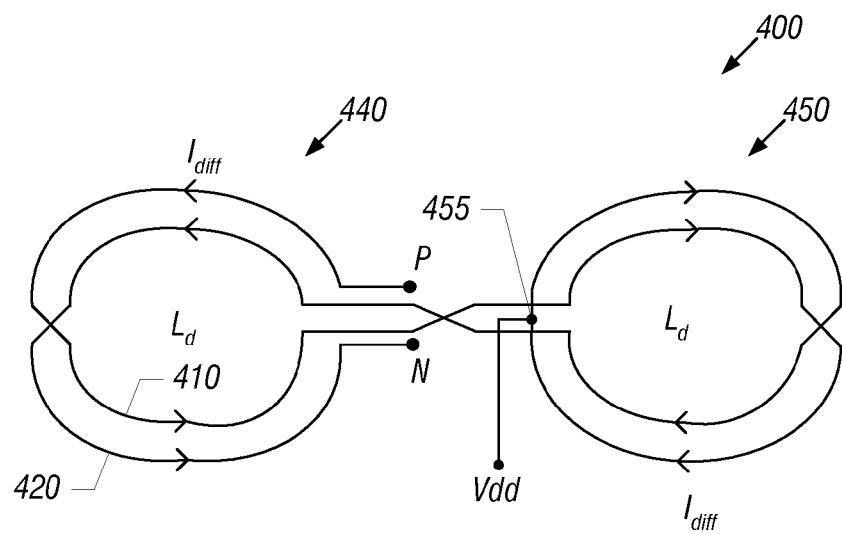

Accordingly, a unit structure for inductors for tracking filters may be as shown in FIG. 6A. Note that while shown with only two turns for convenience in the illustration of FIG. 6A, the scope of the present invention is not limited in this regard. As seen in FIG. 6A, structure 400 includes a positive turn 410 and a negative turn 420, which are cross-coupled. As described above, the cross coupling may be realized by traversing the turns between two layers of a semiconductor device or an integrated passive device. In various implementations, this unit structure may be combined into serial/parallel combinations to realize a given inductor for a specific tracking filter. A parallel implementation is shown in FIG. 6B in which inductor 400' includes two turns 410 and 420, one positive and one negative and both of which are coupled to a center tap (which in turn may be coupled to a supply voltage, e.g., VDD). Such a parallel implementation may be used for realizing smaller-value inductors. Note that the underpass 430 that connects to the supply voltage Vdd does not carry a differential signal. FIG. 6C shows a series implementation. As shown, two unit structures 440 and 450 are used and they are cross coupled together. The input of the first unit structure is coupled to the output of the LNA (not shown in FIG. 6C) and the output of the first unit structure is cross coupled to the input of the second unit structure and the two differential outputs of the second unit structure are tied together at node 455 and coupled to Vdd.

Using a magnetically differential structure for the inductors can reduce spurious coupling mechanisms (e.g., common mode spurs) by 30-40 db, while providing further common mode rejection between LNA and mixer. It is noted that such inductors may have a slightly poorer Q in certain implementations because of metal routing to its center. Accordingly, such magnetically differential inductors may be more effective for small-dimensioned inductors (e.g., at UHF bands) than for larger inductors (e.g., at $VHF_L$ bands). It is to be understood that a magnetically single-ended implementation may be realized with lowest cost and highest Q. However, it may have greater sensitivity to spurs.

Because different considerations are present at the wide range of frequencies at which a tuner in accordance with an embodiment of the present invention is to operate, embodiments may optimize inductor design for the different bands. Referring now to Table 1, shown is an example implementation of inductors for a plurality of tracking filters in accordance with an embodiment of the present invention.

TABLE 1

| Band | Inductor $L_{tot(lt)}$ | Q | Implementation |
|---|---|---|---|
| 50 MHz-120 MHz | L1 | 290 nanoHenries (nH) | ≧6.3 @ 50 MHz | Magnetically single ended |
| 120 MHz-240 MHz | L2 | 88 nH | ≧9.4 @ 120 MHz | Series, magnetically differential |
| 240 MHz-470 MHz | L3 | 28 nH | ≧6 @ 240 MHz | Series, magnetically differential |
| 470 MHz-685 MHz | L4 | 10 nH | ≧30 @ 700 MHz | Parallel, magnetically differential |
| 685 MHz-1000 MHz | L5 | 6 nH | ≧29 @ 810 MHz | Parallel, magnetically differential |

Thus a tracking filter in accordance with an embodiment of the present invention can reject common mode signals, increase performance against blockers, and further remove common mode signals that may be generated by the LNA.

In addition to inductors, capacitors of the different tracking filters may also be differently configured to improve performance. In general, each tracking filter may include a capacitor array having multiple tuning capacitors coupled in parallel that can be selectively switched in or out of the tank, depending upon frequency of a desired channel, and in one embodiment these capacitors can be coded thermometrically. There is a tradeoff in tuning range versus capacitor Q values. In this regard it is noted that the tuning range is tight for most bands.

Further, the capacitors for a given tracking filter may have a high Q value, as each tracking filter has a wide frequency range. For example, Band 5 extends from approximately 685 MHz to 1 GHz. Accordingly, a high Q of approximately 25 is needed to obtain a bandwidth of 40 MHz at 1 GHz. It is further noted that inductance (L) is dominant of Q degradation while capacitance (C) at higher frequencies causes Q degradation.

For best performance, a maximum Q value for a capacitor may try to be attained, as permitted by tuning range. Thus there is generally a tradeoff between tuning range and Q. To break this dependence, capacitors of the tracking filters which are thermometrically coded may be implemented having differently-valued switching resistors to obtain an optimal Q profile. For example, the switching resistance may be smallest for the high frequency bands, while a larger resistance is present for the smaller frequencies. Note the parasitic capacitance of the resistance is smaller when a larger resistor is present (owing to the smaller transistor switch), which may lead to a poorer Q. However as discussed above at lower frequencies this is less significant. In this way, an additional degree of design freedom may be achieved. Thus in various embodiments, switches for a capacitor array of the tracking filters may be designed to obtain a desired Q curve, inverting the conventional Q profile (in which $Q_c$ degrades as frequency increases) to benefit tuning range. Thus at lower frequencies, a larger valued resistor may be provided (having a smaller transistor) leading to less parasitics and but poorer Q.

Figure 7:
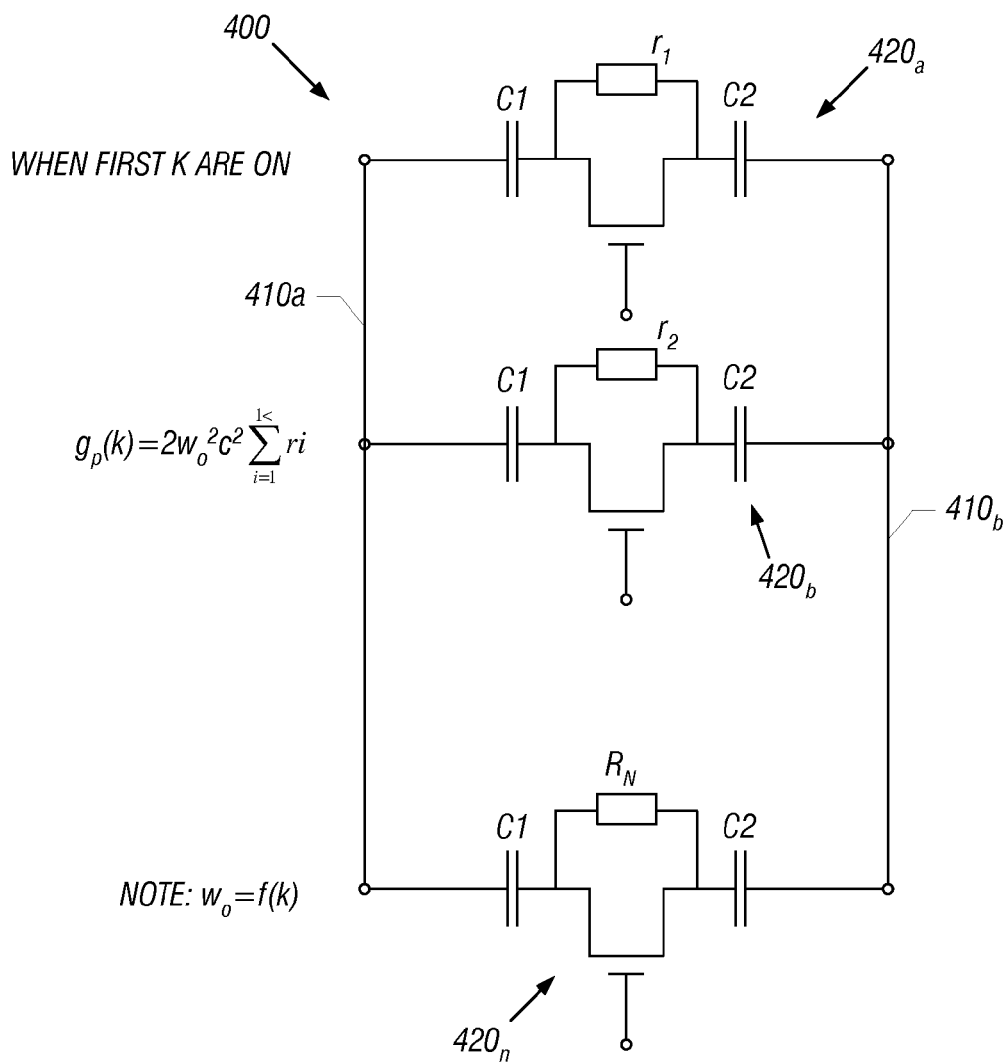
FIG. 7 is a schematic diagram of a capacitor array in accordance with one embodiment of the present invention.

Referring now to FIG. 7, shown is a schematic diagram of a capacitor array in accordance with one embodiment of the present invention. As shown in FIG. 7, capacitor array 400 may include a plurality of parallel paths or array legs 420, each having one or more capacitors coupled between differential input lines 410a and 410b. Understand that array 400 is for a single tracking filter, and a different capacitance array may be present for each tracking filter. In the implementation shown in FIG. 7, each array leg 420 includes a pair of series capacitances C1 and C2. While shown with a set of two series capacitors, more or fewer may be present in different embodiments, and these capacitors can be the same or different values. As further seen, based upon control to meet a desired tuning frequency, each leg 420 includes a switch element 430, which may be configured as a CMOS resistor. The CMOS switch devices may be controlled by a digital control word, in some embodiments. To realize the controllable Q values for the different tracking filters, each of these resistors may be differently valued, ranging from $R_1$-$R_n$. In various implementations, the switches may quickly become increasingly smaller. In one embodiment, e.g., for a tuning filter 5, these switches may range from approximately 19 ohms to 47 ohms for a first order Q grading. Furthermore, a Q value for a given capacitor stage may be in accordance the following equation:

$$Q_C(k) = \frac{1}{2w_o c} \frac{k}{\sum_{1}^{k} Ri},$$

where $\omega_o$ is the frequency, C is the capacitance value, and Ri is the individual switch resistance. While shown with this particular implementation in the embodiment of FIG. 7, the scope of the present invention is not limited in this regard.

In summary, both inductors and capacitors of a tracking filter can be optimally designed to improve operation over the wide frequency range at which they are to operate. Referring now to Table 2 shown is a summary of the tracking filter bands in accordance with one embodiment of the present invention.

TABLE 2

| Band | Freq. Range | $L_{diff}$ | $C_{diff}$ range | Q @ $f_1$ | Q @ $f_2$ | Gain Range | Comments |
|---|---|---|---|---|---|---|---|
| $TF_1$ | 50-120 MHz | 290n | 6p-35p | 5 | ~5 | 18-25.5 dB | BW ≧ 10 MHz, constant Q |
| $TF_2$ | 120-240 MHz | 88n | 5p-20p | 6.6 | ~6.6 | 18.2-24 dB | constant Q |
| $TF_3$ | 240-470 MHz | 28n | 4p-16p | 10.4 | ~10.4 | 18.3-24.2 db | Constant Q |
| $TF_4$ | 470-685 MHz | 10n | 5p-11p | 15 | >15 | 18.0-24.5 db | Const BW |
| $TF_5$ | 685-1000 MHz | 6n | 4p-9p | 17 | >17 | 18.0-24.6 db | const BW |

Accordingly, in various embodiments a tracking filter may at low bands provide harmonic rejection with decent Q values, while at higher bands a smaller bandwidth may be present with a greater Q. Because the harmonic rejection is dependent on Q, the Q level value may be set to meet a harmonic filtering requirement. In one embodiment, at lower bands the Q value may be designed to be better than a predetermined low level (e.g., approximately 5-6), while at higher bands, the values of Q may reach up to approximately 25.

As further discussed above in various embodiments, a capacitive attenuator may be provided between tracking filter and mixer. That is, there is a need for gain control ahead of the mixer. While all such gain control may be implemented in an LNA, various issues can arise, specifically with regard to lower noise figure. In one embodiment, a two stage RF gain control implementation may be realized. By this separation, the attenuator may be highly linear and provide a low noise approach for a gain control knob, while not loading the tank and not attenuating LNA bandwidth. Thus by providing some of the gain control outside of the LNA and before the mixer, there is reduced or no loss of noise figure in the LNA.

Figure 8:
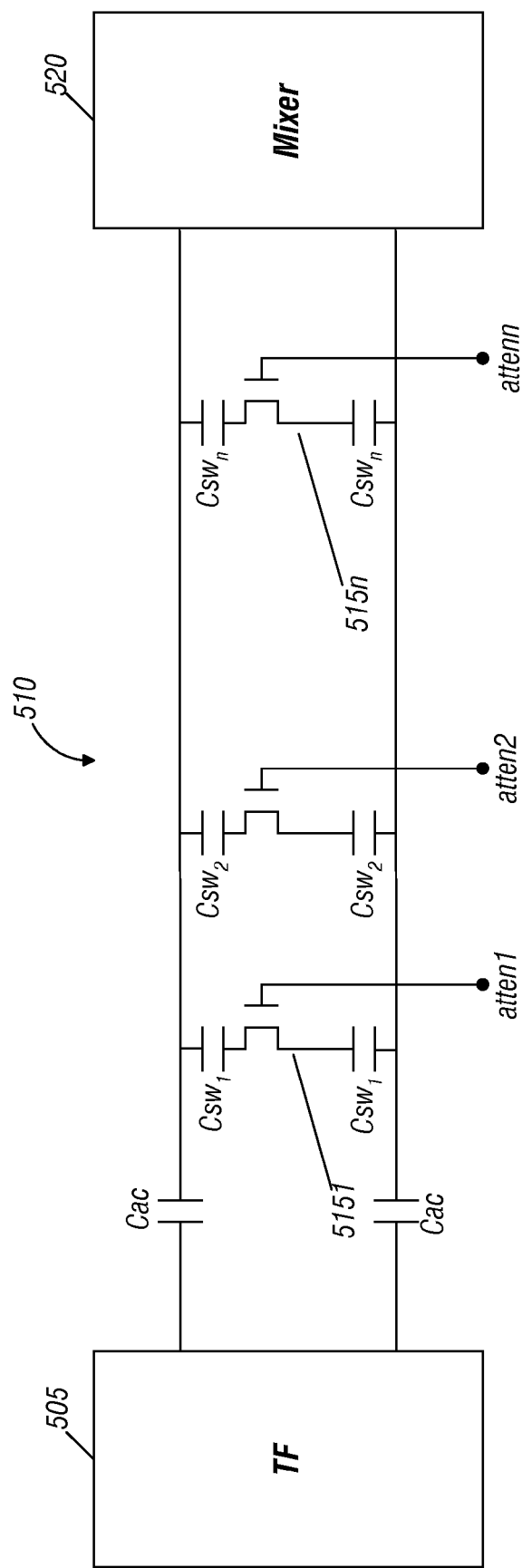
FIG. 8 is an implementation of a capacitive attenuator in accordance with one embodiment of the present invention.

Referring now to FIG. 8, shown is an implementation of a capacitive attenuator in accordance with one embodiment of the present invention. As shown in FIG. 8 the capacitive attenuator array 510 may be coupled between tracking filter 505 and mixer 520. In the implementation shown in FIG. 8, the capacitor attenuator 510 may be realized by a plurality of one or more series-connected switchable capacitors $C_{sw1}$-$C_{swn}$ with the legs 515 coupled in parallel between the signal lines coupled from the tracking filter 505 to mixer 520. Specifically, each leg 515 may have multiple capacitors coupled in series along with a control switch. Each capacitor leg can be selectively coupled to the signal path by way of a control signal (i.e., ATTEN1-N), provided to a switch $M_{sw1}$-$M_{swn}$ coupled between the two capacitors of the leg. Note that in addition to tracking filter and capacitor array, a DC blocking capacitor $C_{ac}$ may further be coupled between these two components.

By separating gain control into at least two blocks, namely in the LNA and a capacitive attenuator, larger blockers may be removed at the same noise figure value. In one embodiment, the gain control in the LNA may provide an attenuation range of approximately 36 db, while the capacitive attenuator may provide an attenuation range of approximately 10 db.

However, the presence of a capacitive attenuator may cause mistuning in the tuning filters. Accordingly, in various embodiments a tuning algorithm may be provided to enable proper tuning of the tuning filters in the presence of a capacitive attenuator (which may have a plurality of different available settings). In one embodiment, the tuning algorithm may be performed on startup and whenever a channel change occurs. In general the algorithm may proceed by determining tuning capacitor values for each capacitive attenuator setting. The resulting tuning capacitor values for each capacitive attenuator setting are stored in a table and after having tuned to a given channel frequency and depending on the capacitive attenuator setting as determined by the AGC loop, the appropriate tuning capacitor value from the table is used such that the tracking filter is not mistuned. For analog TV, the changes in the capacitor attenuator settings and the corresponding change in tuning capacitor values, may be done during the vertical blanking interval.

Figure 9:
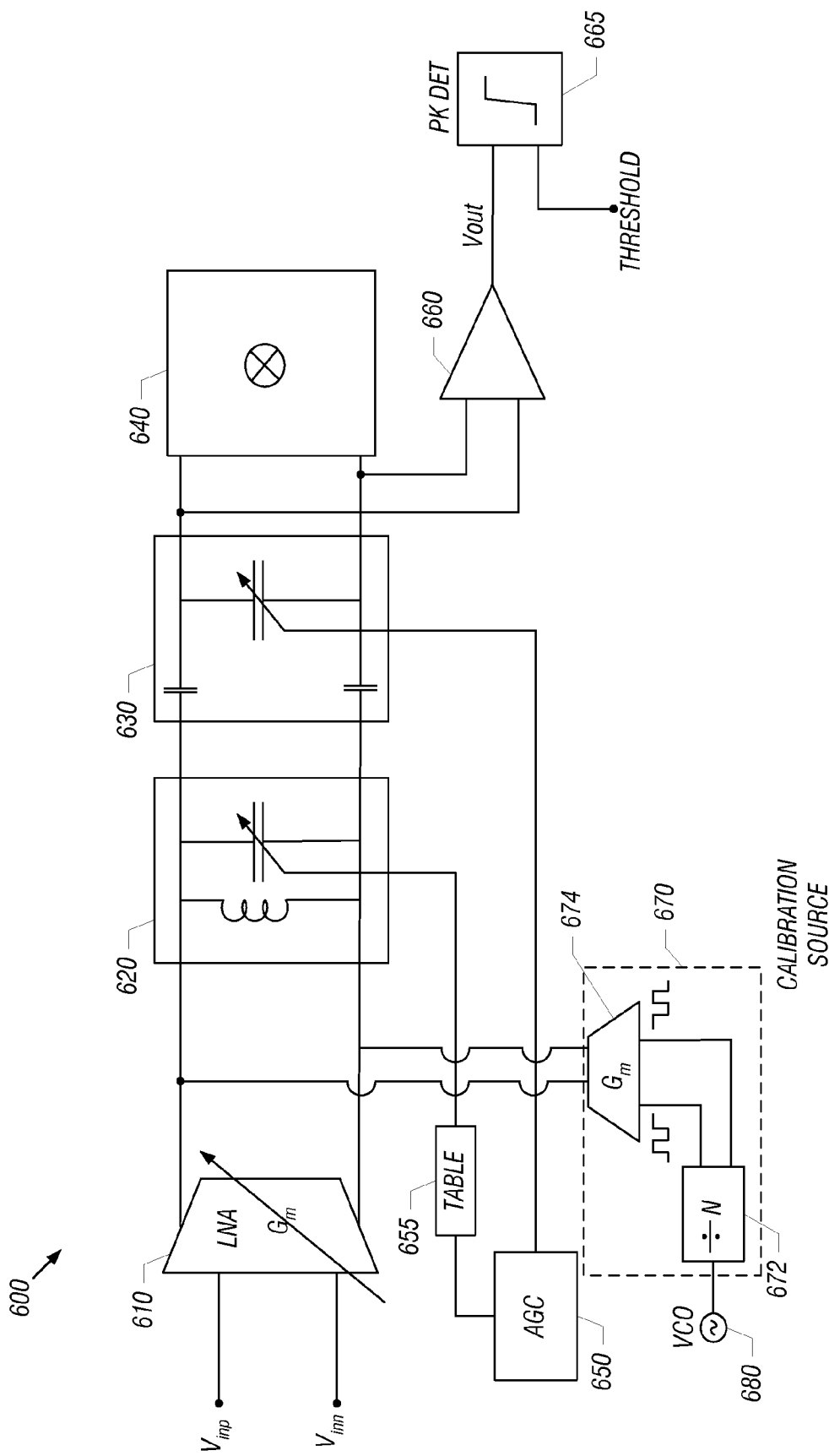
FIG. 9 is an implementation of an analog front end that includes a controlled oscillator in accordance with one embodiment of the present invention.

Referring now to FIG. 9, shown is an implementation of an analog front end that includes a controlled oscillator 680, e.g., a voltage controlled oscillator (VCO) that can be used to perform the tuning algorithm (e.g., during a blanking interval) by insertion of a predetermined frequency via a calibration source 670 that includes a programmable divider 672 and a gain element 674. During a tuning operation, an input into LNA 610 may be switched out while this controlled frequency, which may correspond to a frequency of a desired channel, is input via calibration source 670 and provided to tracking filter 620, the output of which is provided through attenuator network 630 and, instead of to mixer 640, to a detection circuitry including an amplifier 660 and a peak detector 665. Based on the received values, compensation values to thus tune tracking filter 620 to the desired channel may be determined and stored in a lookup table 655. This table may then be accessed by gain control circuit 650 when a gain control signal for a corresponding attenuator setting is provided to attenuator network 630. In general, the tuning algorithm may sweep a peak detection threshold to find a value where the expected peak resides. Then a lower threshold may be set for the peak detector and the tuning capacitor swept to find the two tuning capacitor codes at which the peak detector trips. The actual tuning capacitor code corresponding to the desired channel frequency is the average of these two tuning capacitor codes.

Figure 10:
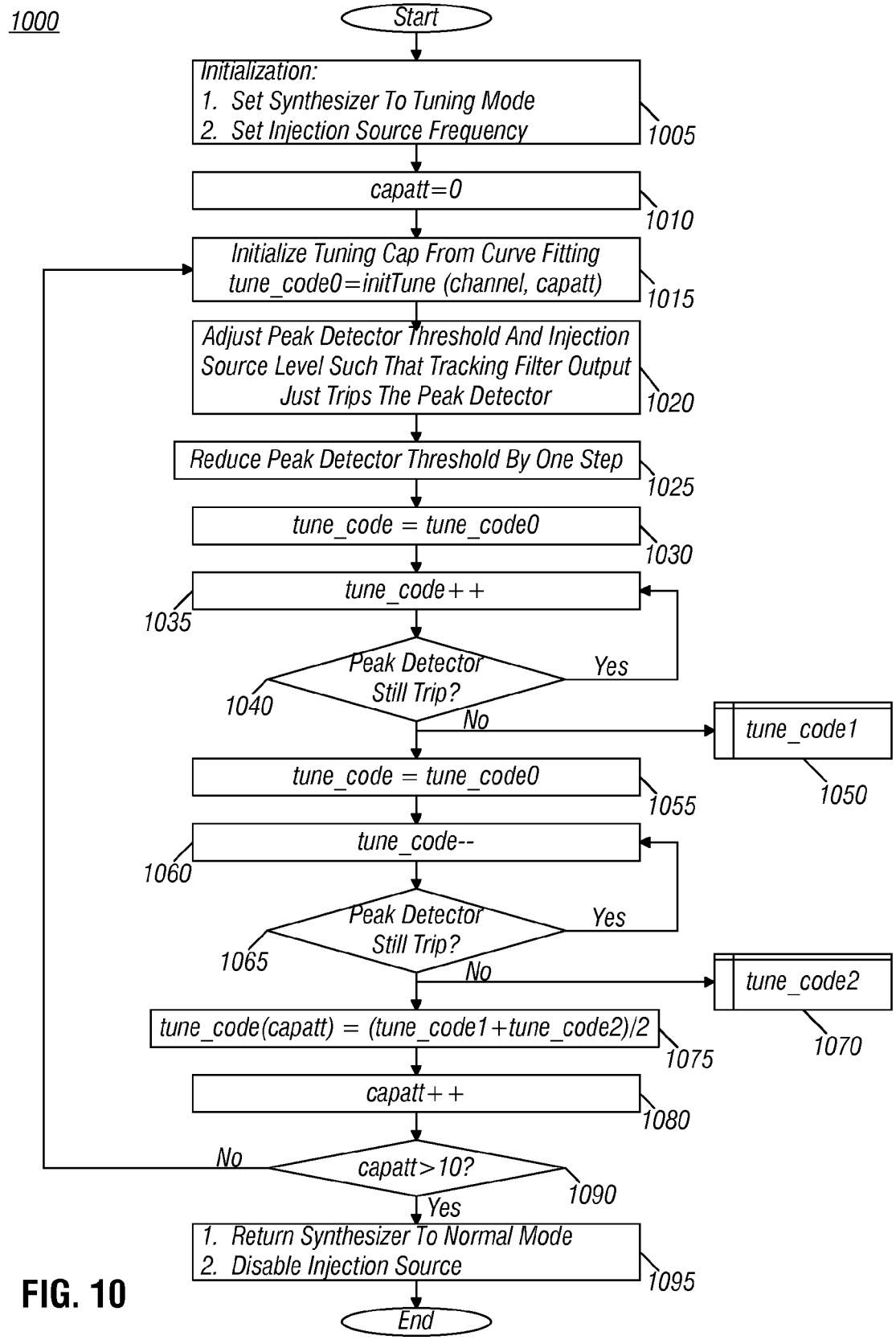
FIG. 10 is a flow diagram of a tuning method in accordance with one embodiment of the present invention.

Referring now to FIG. 10, shown is a flow diagram of a tuning method in accordance with one embodiment of the present invention. As shown in FIG. 10, the tuning method may begin by initializing the synthesizer to a tuning mode and setting the injection source frequency, e.g., to the desired frequency of the channel to be tuned (block 1005). Next the capacitive attenuator is set to its first setting (block 1010). Then the tuning capacitor of the tracking filter may be initialized to its initial value, e.g., obtained from a curve fitting. This initial tuning value (e.g., a tuning code such as a digital word that is used to control the switches of a capacitor array of the filter) may correspond to the initial value for the given channel and attenuator setting (block 1015). Then the peak detector threshold may be adjusted and the injection source level also adjusted such that the tracking filter output just trips the peak detector (block 1020). Then the peak detector threshold may be reduced by a step (block 1025). A tuning code may then be set to the initial tuning code (block 1030). Then the tuning code may be incremented (block 1035). It may then be determined whether the peak detector still trips (diamond 1040). If so, control passes back to block 1035. Otherwise, this tuning code value may be stored in a first storage as a first tuning code value (block 1050).

Control then passes to block 1055, where the initial tuning code may again be applied to the tuning filter and from there the tuning code for the filter is decremented (block 1060). It may then be determined whether the peak detector still trips (diamond 1065). If so, control passes back to block 1060. Otherwise, the current tuning code value may be stored in a second storage as a second tuning code (block 1070). Then a tuning code value for the capacitive attenuator setting may be determined in block 1075. In one embodiment, this tuning code value may be conditioned as corresponding to the average of The first and second tuning code values (e.g., (Tuning Code 1+Tuning Code 2)/2).

This tuning code value may be stored in a table and the tuning algorithm may be run for the next attenuator setting. Accordingly, control passes to block 1080 where the attenuator setting is incremented. It may be determined whether all array attenuator settings have been performed (e.g., 10 in some embodiments) (diamond 1090). If not, control passes back to block 1015. Otherwise, the tuning method concludes and the synthesizer is returned to its normal mode and the injection source is disabled (block 1095). While shown with this particular implementation in the embodiment of FIG. 10, the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a low noise amplifier (LNA) to receive a radio frequency (RF) signal and to amplify the RF signal;
   a plurality of tracking filters coupled to the LNA and in parallel to each other, to filter the amplified RF signal, wherein a first set of the tracking filters are each configured to maintain a substantially constant Q value across a bandwidth of the corresponding tracking filter operation and a second set of the tracking filters are each configured to maintain a substantially constant bandwidth across the bandwidth of the corresponding tracking filter operation;
   a mixer coupled to the plurality of tracking filters to receive and downconvert the filtered RF signal; and
   a capacitive attenuator coupled between each of the tracking filters and the mixer, the capacitive attenuator controllable to operate at a plurality of settings.

2. The apparatus of claim 1, wherein one of the plurality of tracking filters is controllably selected to receive the amplified RF signal based on a frequency of the RF signal, under control of a microcontroller.

3. The apparatus of claim 1, wherein at least one of the tracking filters includes a magnetically differential inductor having at least one positive turn and at least one negative turn that are cross-coupled.

4. The apparatus of claim 3, wherein at least one of the tracking filters includes a magnetically single-ended inductor.

5. The apparatus of claim 3, wherein the at least one positive turn travels from a first metal layer of a semiconductor device to a second metal layer of the semiconductor device, and the at least one negative turn travels from the second metal layer to the first metal layer.

6. The apparatus of claim 1, wherein the tracking filters include a first magnetically differential inductor having a series configuration and a second magnetically differential inductor having a parallel configuration, each of the magnetically differential inductors having at least one positive turn and at least one negative turn that are cross-coupled, the at least one positive turn extending from a first metal layer of a semiconductor device to a second metal layer of the semiconductor device, and the at least one negative turn extending from the second metal layer to the first metal layer.

7. The apparatus of claim 6, wherein each of the first and second magnetically differential inductors is coupled to a corresponding capacitor array of the corresponding tracking filter, each capacitor array coupled between a first line and a second line and including a set of parallel paths having at least one capacitor and a switching device to controllably couple the corresponding at least one capacitor to the first and second lines.

8. The apparatus of claim 7, wherein at least some of the switching devices, each configured as a CMOS resistor, in each capacitor array are of different sizes.

9. The apparatus of claim 1, further comprising a table to store a corresponding compensation factor for each tracking filter at each of the plurality of settings, wherein the compensation factor is to maintain tuning of the tracking filter at the corresponding capacitive attenuator setting.

10. The apparatus of claim 9, wherein the compensation factor is determined based on an average of a first tuning code for a capacitor array of the tracking filter when a peak detector output does not trip a threshold and a second tuning code for the capacitor array when the peak detector output does not trip the threshold.

11. An apparatus comprising:
    a tracking filter to be coupled between a front end amplifier that is to receive a television signal and a mixer that is to downconvert the television signal to an intermediate frequency (IF) signal, wherein the tracking filter includes a plurality of tanks each to cover a band of television channels, at least one of the tanks having an inductor configured as a magnetically differential inductor having at least one positive turn and at least one negative turn that are cross-coupled, wherein the at least one positive turn travels from a first metal layer of a first semiconductor die to a second metal layer of the first semiconductor die, and the at least one negative turn travels from the second metal layer to the first metal layer, the magnetically differential inductor to reduce magnetic interference and provide common mode rejection, and the plurality of tanks each further having a capacitor array coupled between a first line and a second line, each capacitor array including a set of parallel paths having at least one capacitor and a switching device to controllably couple the corresponding at least one capacitor to the first and second lines, wherein a Q profile of the capacitor array is to increase over an increasing frequency range of the corresponding band;
    a capacitor attenuator coupled between the plurality of tanks and the mixer; and
    a table to store a corresponding compensation factor for each tracking filter at each of a plurality of settings of the capacitor attenuator, wherein the compensation factor is to maintain tuning of the tracking filter at the corresponding capacitor attenuator setting.

12. The apparatus of claim 11, wherein each of the capacitor arrays is configured on a second semiconductor die, wherein the second semiconductor die further includes the front end amplifier, the mixer, and digital circuitry to process the IF signal.

13. The apparatus of claim 11, wherein the plurality of tanks includes a first set of tanks each configured to maintain a substantially constant Q value across a bandwidth of the corresponding tank and a second set of tanks each configured to maintain a substantially constant bandwidth across the bandwidth of the corresponding tank.

14. A method comprising:
setting a tuning value for a capacitor array of a tracking filter of a television tuner coupled between an amplifier and a mixer to an initial value for a corresponding setting of a capacitive attenuator coupled between the tracking filter and the mixer, setting a threshold of a peak detector coupled to the capacitor array to cause an output of the tracking filter to trip the peak detector, and decrementing the peak detector threshold;
sequentially incrementing the tuning value and determining whether the peak detector trips, until the peak detector does not trip;
storing the tuning value when the peak detector does not trip in a first storage;
sequentially decrementing the tuning value and determining whether the peak detector trips, until the peak detector does not trip; storing the tuning value when the peak detector does not trip in a second storage; and
calculating a tuning code for the capacitor array to be substantially an average of the values stored in the first and second storages, and storing the tuning code in a compensation table.

15. The method of claim 14, wherein the tuning code is stored in a first entry of the compensation table associated with the tracking filter and the corresponding setting of the capacitive attenuator.

16. The method of claim 15, further comprising accessing the first entry when an automatic gain control (AGC) circuit selects a corresponding capacitive attenuator setting, and controlling the capacitor array using the tuning code of the first entry.

17. The method of claim 14, further comprising performing the setting, sequential incrementing, storing, sequential decrementing, storing, and calculating for a plurality of settings of the capacitive attenuator and for a plurality of capacitor arrays of a plurality of tracking filters.

* * * * *